(12) United States Patent
Coulon et al.

(10) Patent No.: US 8,901,692 B2
(45) Date of Patent: Dec. 2, 2014

(54) IMAGING DEVICE WITH FILTERING OF THE INFRARED RADIATION

(75) Inventors: David Coulon, Aix en Provence (FR); Benoit Deschamps, Sassenage (FR); Frédéric Barbier, Grenoble (FR)

(73) Assignees: STMicroelectronics (Grenoble 2) SAS, Grenoble (FR); STMicroelectronics (Rousset) SAS, Rousset (FR); STMicroelectronics SA, Montrouge (FR)

( * ) Notice: Subject to any disclaimer, the term of this patent is extended or adjusted under 35 U.S.C. 154(b) by 105 days.

(21) Appl. No.: 13/316,938

(22) Filed: Dec. 12, 2011

(65) Prior Publication Data
US 2012/0153422 A1   Jun. 21, 2012

(30) Foreign Application Priority Data
Dec. 15, 2010   (FR) ...................... 10 60561

(51) Int. Cl.
*H01L 27/14* (2006.01)
*H01L 27/146* (2006.01)

(52) U.S. Cl.
CPC .... *H01L 27/14647* (2013.01); *H01L 27/14689* (2013.01)
USPC ................... 257/431; 257/435; 257/E31.122; 257/E31.127

(58) Field of Classification Search
USPC ................... 257/431, 435, E31.122, E31.127
See application file for complete search history.

(56) References Cited

U.S. PATENT DOCUMENTS

| | | | |
|---|---|---|---|
| 6,894,265 B2 * | 5/2005 | Merrill et al. | 250/208.1 |
| 2002/0058353 A1 * | 5/2002 | Merrill | 438/57 |
| 2004/0178478 A1 * | 9/2004 | Shizukuishi | 257/620 |

* cited by examiner

*Primary Examiner* — Robert Huber
(74) *Attorney, Agent, or Firm* — Slater & Matsil, L.L.P.

(57) ABSTRACT

An imaging device includes at least one photosite formed in a semiconducting substrate and fitted with a filtering device for filtering at least one undesired radiation. The filtering device is buried in the semiconducting substrate at a depth depending on the wavelength of the undesired radiation.

23 Claims, 3 Drawing Sheets

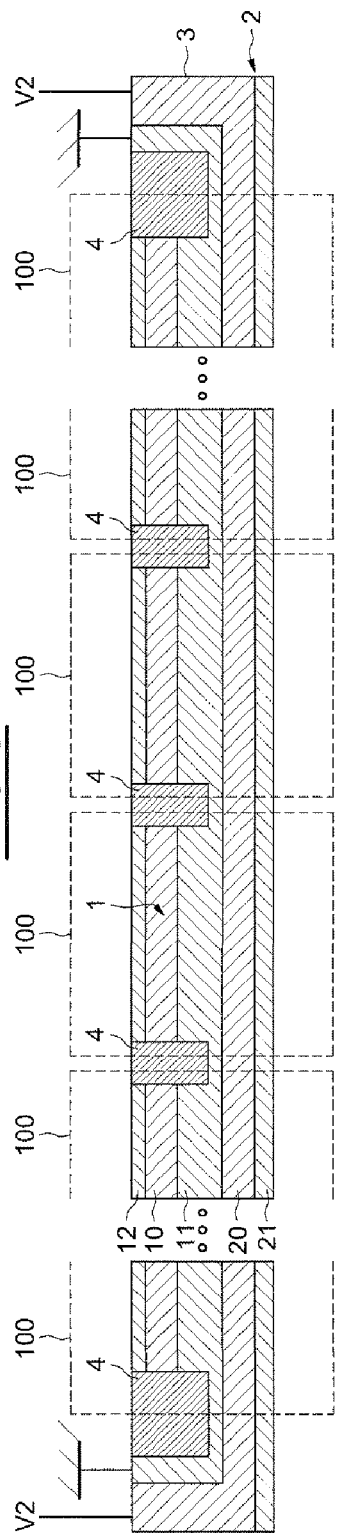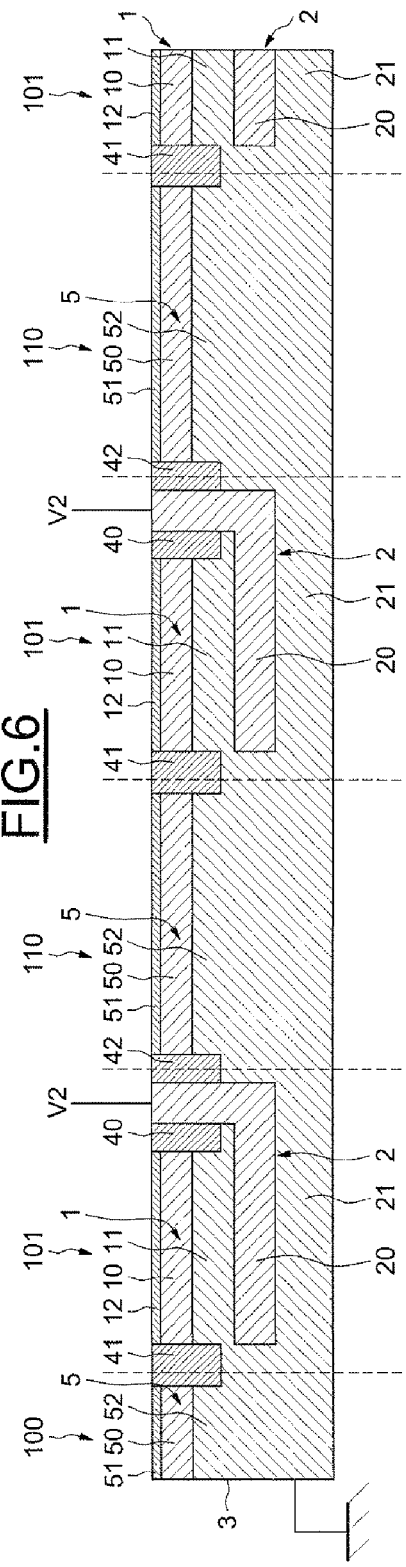

IMAGING DEVICE WITH FILTERING OF THE INFRARED RADIATION

CROSS-REFERENCE TO RELATED APPLICATIONS

This application claims the priority benefit of French patent application number 1060561, filed on Dec. 15, 2010, which is hereby incorporated by reference to the maximum extent allowable by law.

TECHNICAL FIELD

The invention relates to imaging devices and more particularly the filtering of undesired radiations such as the infrared radiation.

BACKGROUND

When an image is captured by an imaging device, a broad band of wavelengths is captured by the device. Depending on the finality of the image, not all the wavelengths are of use. In the case of imaging devices such as CMOS or CCD sensors of a digital camera, for example, only a small portion of the captured radiation is of use, this portion corresponding to the wavelengths of the visible domain. The infrared radiation, for example, that is undesired in the captured images then disrupts the image.

Specifically, infrared radiation also generates electrons by photoelectric effect. These electrons thus generated by the infrared radiation induce a signal which, by mixing with the signal corresponding to the visible radiation, will disrupt the measured signal and add an additional interference value to the useful signal. The quality of the images is thereby damaged.

In general, in order to filter the infrared radiation arriving on a photosite, the imaging devices such as CMOS or CCD sensors comprise an infrared filter placed above the photosite, that is to say between the incident radiations and the photosite. This infrared filtering prevents the infrared radiation from reaching the photosite while the visible radiation passes through the filter and can reach the photosite and generate electron-hole pairs then inducing a measurable signal.

The application of such infrared filters, usually produced in glass or in plastic, makes the production of an imaging device more complex, increases the production costs and increases the overall height since the height of the superposed infrared filter must be added to the height of the photosite.

SUMMARY

According to one embodiment, the proposal is to alleviate the above-mentioned drawbacks by proposing an imaging device comprising photosites fitted with filtering means incorporated into the photosite, and more particularly buried beneath the photodiode.

According to one aspect, an imaging device is proposed comprising at least one photosite formed in a semiconducting substrate and fitted with a filtering device for filtering at least one undesired radiation.

According to a general feature of this aspect, the filtering device is buried in the semiconducting substrate at a depth depending on the wavelength of the undesired radiation.

Preferably, at least one undesired radiation comprises an infrared radiation and the buried portion is situated at a depth of between 2 µm and 5 µm.

The undesired radiation may correspond to the infrared radiation, but it may also correspond to a thinner or broader frequency band included in the visible or invisible radiation.

The at least one photosite preferably comprises a first semiconducting P-N junction and the buried portion comprises a second semiconducting P-N junction located beneath the first semiconducting junction.

Since the second semiconducting P-N junction of the buried portion is located beneath the first P-N junction, the filtered radiation will preferably include longer wavelengths than the desired and measured wavelengths. The dimensions and the placing of the second P-N junction therefore depend on the undesired radiation that it is intended to filter out.

The photodiode of a conventional photosite does not usually comprise a semiconducting junction. By modifying the structure of the photodiode during the construction of the photosite, it is possible to carry out a filtering of an undesired radiation such as an infrared radiation. The installation of the photodiode is therefore carried out in order to obtain a superposition of two semiconducting junctions, a first junction generating a measured signal in order to obtain an image, and a second junction placed beneath the first making it possible to filter the undesired radiation.

In other words, it is possible to produce, in a substrate having dimensions that are generally designed to produce a single semiconducting junction of a photosite, a double semiconducting junction. The buried semiconducting junction makes it possible to filter the radiation by trapping the electrons generated by photoelectric effect by the incident radiation at this buried junction.

Advantageously, the filtering device may also comprise a polarization device configured to polarize the second junction at a voltage greater than the polarization voltage of the first junction.

This polarization of the second semiconducting junction at a voltage greater than the polarization voltage of the first semiconducting junction makes it possible to confine in the second junction the electrons created in this same junction. The collection of these electrons is thus improved by this difference in polarization voltage. Moreover, because of the depth at which the second junction is situated, the electrons created in this second junction have been mainly generated by undesired radiation, such as infrared radiation. This trapping of electrons therefore makes it possible to filter out the undesired radiation.

Advantageously, the device may comprise at least one set of adjacent photosites each fitted with a filtering device, and the buried portion of the filtering devices of the adjacent photosites may be coupled together.

The device may also advantageously comprise two continuous semiconducting layers of the opposite conductivity type, incorporating the second P-N junctions of the buried means associated with the adjacent photosites.

Advantageously, the device may comprise a first group of photosites not fitted with the filtering devices, and a second group of photosites each fitted with a filtering device.

According to another aspect, a method is proposed for filtering at least one undesired radiation illuminating at least one photosite produced in a semiconducting substrate.

According to a general feature of this other aspect, the filtering is carried out in the semiconducting substrate at a depth depending on the wavelength of the undesired radiation.

Preferably, the at least one undesired radiation comprises an infrared radiation and the filtering is carried out in the semiconducting substrate at a depth of between 2 µm and 5 µm.

Advantageously, the filtering may comprise a trapping of the electrons created in a second semiconducting junction placed beneath a first semiconducting junction of the photosite.

Preferably, the second semiconducting junction is polarized at a polarization potential greater than the polarization potential of the first semiconducting junction.

BRIEF DESCRIPTION OF THE DRAWINGS

Other advantages and features of the invention will appear on examination of the detailed description of modes of application and of embodiments which are in no way limiting, and of the appended drawings in which:

FIG. 5 represents schematically a view in section of an imaging device comprising a set of photosites fitted with filtering devices according to a first embodiment;

FIG. 6 represents schematically a view in section of an imaging device according to a second embodiment, comprising photosites fitted with filtering devices and photosites not fitted with filtering devices.

DETAILED DESCRIPTION OF ILLUSTRATIVE EMBODIMENTS

Figure 1:
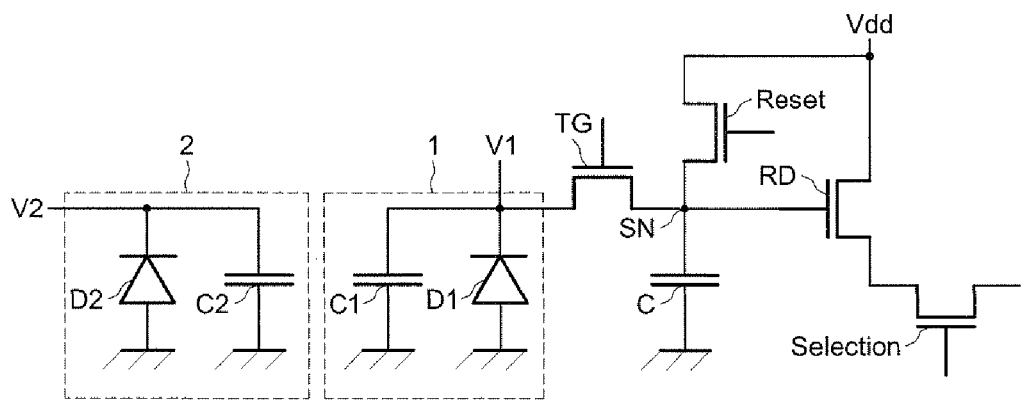
FIG. 1 shows an electrical diagram of a semiconducting photosite fitted with a filtering device according to one embodiment of the invention.

FIG. 1 shows an electrical diagram of a semiconducting photosite fitted with a filtering device according to one embodiment of the invention.

The semiconducting photosite comprises a first semiconducting P-N junction 1 forming first load collection device making it possible to convert the incident radiation, mainly the visible radiation, into electron-hole pairs by photoelectric effect, and thus generate a signal from the electrons that is proportional to the number of incident photons received.

This first junction 1 is represented in the electrical diagram by a capacitor C1 and a diode D1 mounted in parallel. The first junction 1 is coupled, in the illustrated example, to control electronics comprising in this instance a set of four controlled transistors TG, RD, Reset and Selection. The signal generated by this first junction 1 is transferred via a transfer transistor TG (for Transfer Gate) to a sensing node SN.

The sensing node SN is formed of a total of capacitors C on which the voltage is measured when a sensing transistor RD (for Read out Gate), also coupled to the sensing node SN, is enabled. The sensing node SN is also coupled to a Reset transistor making it possible to reset the first junction 1. The sensing transistor RD and the Reset transistor are coupled together at the power-supply voltage Vdd. Finally, the read out transistor RD is also coupled to a Selection transistor controlled by control circuitry of the matrix network capable of controlling the photosites depending on the column and the row.

The semiconducting photosite also comprises a second semiconducting junction 2 forming second load collection device making it possible to convert the radiation reaching this second junction 2, mainly the infrared radiation, into an electron-hole pair by photoelectric effect, and thus generate a signal from the electrons that is proportional to the number of photons received.

This second junction 2 is polarized at a voltage V2 which makes it possible to clear away the generated electrons.

The first junction 1 and the second junction 2 each receive a different effective radiation because of their position within the photosite. Specifically, as illustrated in FIG. 2, the first junction 1 and the second junction 2 are superposed on one another, the first junction 1 being placed above the second junction 2.

Figure 2:
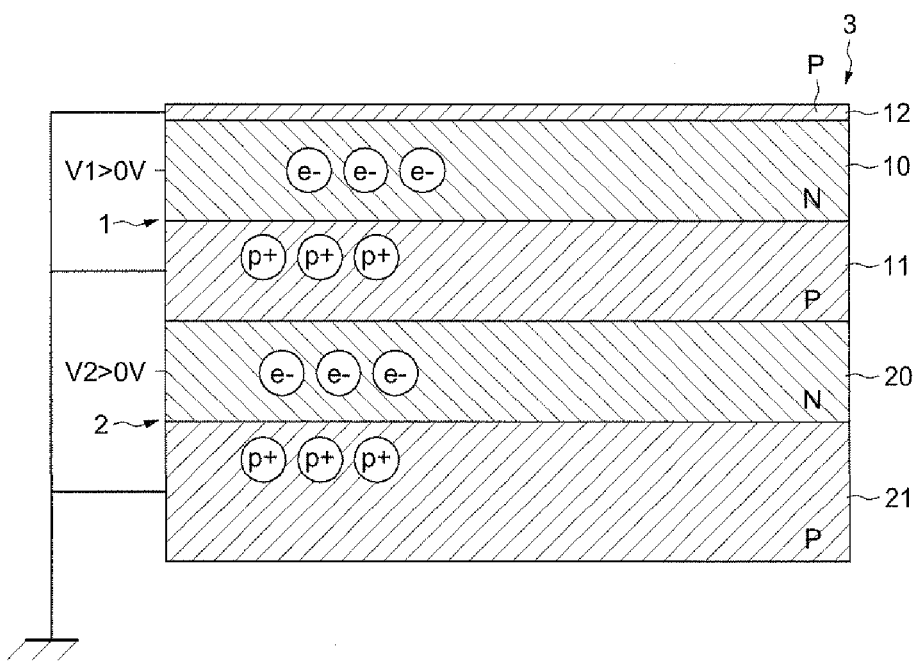
FIG. 2 illustrates a vertical section of a double junction formed in a semiconducting substrate according to one embodiment of the invention.

FIG. 2 illustrates a vertical section of a double junction formed in a semiconducting substrate according to one embodiment of the invention.

Shown in this FIG. 2 is a semiconducting substrate 3 comprising the first semiconducting junction 1 superposed on the second semiconducting junction 2.

The substrate 3 is a semiconducting substrate having standard dimensions, notably in height, and initially P-doped. In order to obtain the double junction, first of all a first implantation of an N-doped layer 20 is carried out, for example of dosed phosphorous between $4 \times 10^{12}$ and $8 \times 10^{12}$ at/cm$^2$ at an energy of between 2 and 5 MeV. This first implantation is carried out so as to be superposed on a P-doped layer 21 of substrate 3 having a thickness of between 3 and 10 µm.

Then in turn a second implantation of a P-doped layer 12 is carried out, for example, of boron dosed between $1.10^{12}$ and $5.10^{12}$ at/cm$^2$ at an energy of between 10 and 50 keV, a third implantation of an N-doped layer 10, for example, of arsenic dosed between $4.10^{12}$ and $8.10^{12}$ at/cm$^2$ at an energy of between 100 and 300 keV, and a fourth implantation of a P-doped layer 11, for example, of boron at a dose between $4.10^{12}$ and $8.10^{12}$ at/cm$^2$ at an energy of between 4 and 15 keV.

This provides a superposition of a pinched-off photodiode comprising successively the layers 11, 10 and 12 respectively P-doped, N-doped and P-doped and defining the first P-N junction 1 at the layers 10 and 11. The layers 11 and 12 are connected to the same potential, for example ground. This configuration provides another photodiode comprising a second P-N junction 2 comprising the layers 20 and 21 respectively N-doped and P-doped.

The superposition of the layers 10 and 12 forms a P-N junction with a surface making it possible to limit the dark current. The dark current corresponds to a current induced by surface defects.

The various installations are carried out so as to obtain a first P-N junction 1 situated at a depth of between 0 and 0.5 µm and a second P-N junction 2 situated at a depth of between 2 and 5 µm.

Figure 3:
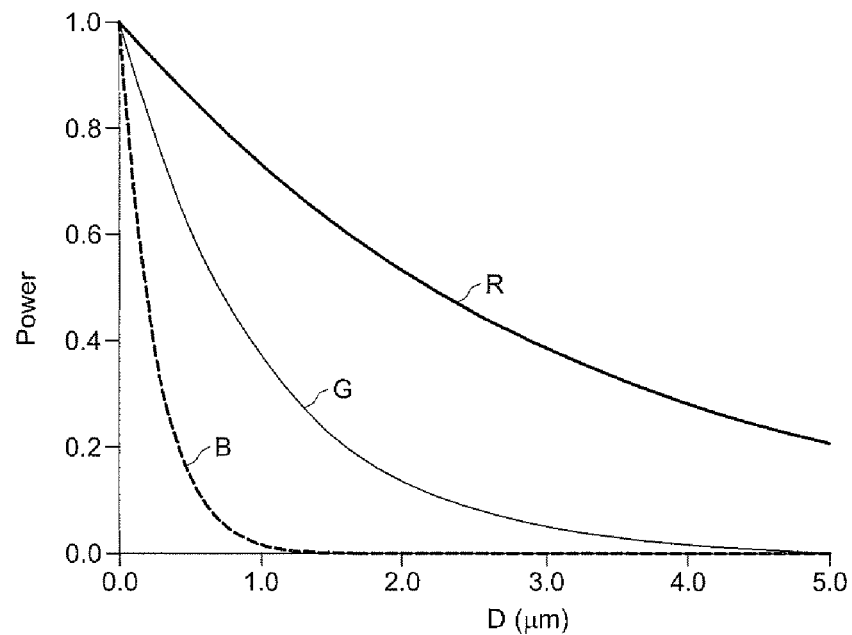
FIG. 3 illustrates graphically an example of absorption rate of the photons through the thickness of the semiconductor depending on their wavelength of the incident radiation.
Figure 4:
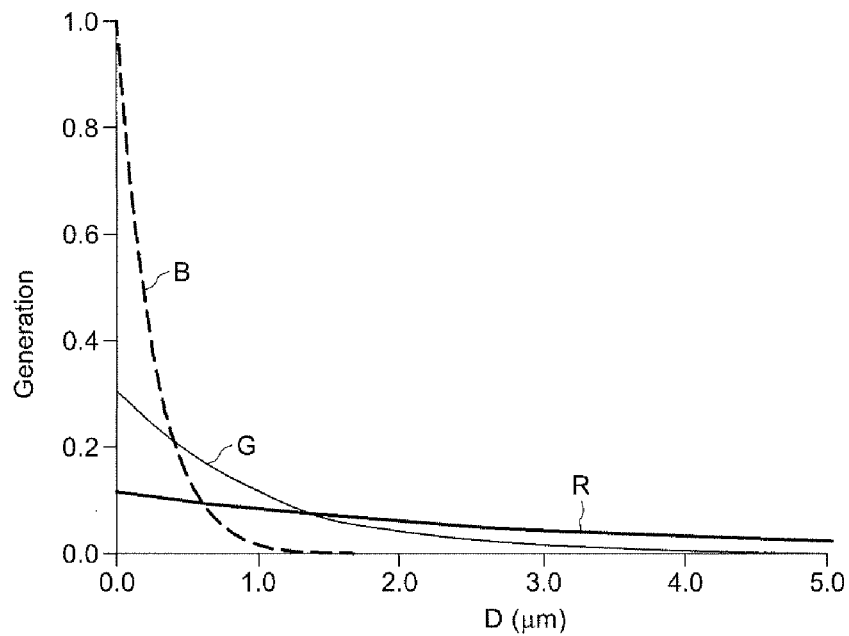
FIG. 4 illustrates graphically an example of rate of generation of electron-hole pairs through the thickness of the semiconductor as a function of the wavelength of the incident radiation.

The filtering of the radiation by virtue of the use of a semiconducting junction buried in a semiconducting substrate beneath a main junction, such as the second junction 2 located beneath the first junction 1, is explained with the aid of FIGS. 3 and 4.

FIGS. 3 and 4 illustrate, respectively, on a graph the rate of absorption of the photons and the rate of generation of electron-hole pairs through the thickness of a semiconducting substrate depending on the wavelength of the incident radiation.

The graph of FIG. 3 shows, on three curves R, G and B, the evolution of the optical power (on the Y axis) as a function of the depth of substrate traversed (on the X axis in micrometers) for three distinct wavelengths. The wavelength considered for the curve B corresponds to blue (450 nm), the wavelength considered for the curve G corresponds to green (550 nm) and the wavelength considered for the curve R corresponds to red (650 nm). The infrared corresponds to the wavelengths above 650 nm. On the Y axis, the optical power is normalized relative to the power of the incident radiation before entry into the substrate for each wavelength.

On reading this graph, it can be seen that the decrease in the optical power of the incident radiation is greater, the shorter the radiation wavelength. Thus, a short radiation wavelength is absorbed more rapidly than a long radiation wavelength. Specifically, in this example, the optical power of the blue radiation, curve B, decreases more rapidly than that of the red, curve R. The optical power of the blue radiation is virtually zero after the incident radiations have traversed 1.2 μm of substrate, while the optical power of the red radiation has reduced only by half at a depth of 2.5 μm.

Consequently, at a considerable depth of substrate, for example, more than 2 μm, the infrared radiation that belongs to the wavelengths greater than the wavelengths of the visible domain will have been much less absorbed than the visible radiation. The infrared radiation will therefore be in the majority at this depth relative to the visible radiation.

The graph of FIG. 4 shows, for the same three wavelengths as in FIG. 3, the evolution of the relative rate of generation of electron-hole pairs (on the Y axis), as a function of the depth of substrate traversed (on the X axis in micrometers).

On reading this graph, it can be seen that the short wavelengths have a rate of generation of electron-hole pairs that is higher on the surface, that is to say at slight depth of substrate, than the long wavelengths, while at depth, that is to say, at a considerable depth of the substrate, the long wavelengths have a rate of generation of electron-hole pairs that is higher than the short wavelengths.

Therefore, it can be seen that, over the first microns of the substrate, the majority of the electron-hole pairs generated by the incident radiation will be generated by the visible radiation, the electron-hole pairs generated by the infrared radiation being negligible, whereas at depth, from approximately 2 μm for example, the electron-hole pairs generated will be mainly generated by the infrared radiation, the electron-hole pairs generated by the visible radiation being negligible, the power of the visible radiation being less (FIG. 3) and the rate of generation of electron-hole pairs equally being less than that for the infrared radiation.

Therefore, in FIG. 2, it can be understood that the electron-hole pairs generated by the incident radiation at the first junction 1 are generated mainly by the visible radiation, while the electron-hole pairs generated at the second junction 2 are mainly generated by the infrared radiation. The electrons originating from the infrared radiation generated at the second junction 2 are then cleared from the photosite, while the electrons of the first junction generated mainly by the visible radiation create a signal which is measured at the sensing node SN. This signal thus measured is a signal corresponding to the visible radiation filtered from the majority of the infrared radiation.

Moreover, the first junction 1 is polarized intrinsically at a first positive polarization voltage V1, while the second junction 2 is polarized at a second positive polarization voltage V2. In order to improve the trapping of the electrons originating from the infrared radiation in the second junction 2 and to prevent them from migrating to the first junction 1, the second polarization voltage V2 is higher at the first intrinsic polarization junction V1. The first polarization voltage V1 is generated intrinsically by the doping of the pinched-off photodiode.

In FIG. 1, the first polarization voltage V1 is the floating voltage defined by doping of the pinched-off diode.

FIG. 5 shows schematically a view in section of an imaging device comprising a set of photosites 100 fitted with filtering devices according to a first embodiment.

In this embodiment, the imaging device comprises, on one and the same row or one and the same column of a matrix network of photosites, a set of photosites 100 fitted with filtering devices.

Each photosite 100 formed in a semiconducting substrate 3, initially with positive conductivity, comprises a first semiconducting junction 1 comprising a layer 10 of negative conductivity comprised between two layers 11 and 12 of positive conductivity forming a pinched-off photodiode. A second semiconducting junction 2 is buried in the substrate 3 and located beneath the first junction 1. The junction 2 comprises a layer 20 of negative conductivity above a layer 21 of positive conductivity, thereby forming another photodiode.

The filtering devices of the photosites 100, that is to say the second junctions 2, are produced so as to be commoned, e.g., commonly connected. Thus, the layer 20 of negative conductivity of the second junction 2 is a DC layer produced at depth in the substrate 3 so as to obtain a second DC junction 2 over the whole row or over the whole column of photosites. The layer 20 of the second DC junction 2 is polarized at the second polarization voltage V2 so as to clear away the electrons generated at the second junction 2.

The first junction 1 of each photosite 100, and more particularly the N-doped layer 10, is insulated from the first junction 1 of the adjacent photosites 100. For this, an insulation wall 4 (e.g., trench isolation), made of silicon dioxide for example, is located between the first junctions 1 of the photosites 100.

FIG. 6 shows schematically a view in section of an imaging device according to a second embodiment where photosites 101 fitted with filtering devices and photosites 110 not fitted with filtering devices.

In this second embodiment, the imaging device comprises, on one and the same row or one and the same column of a matrix network of photosites, photosites 101 fitted with filtering devices alternating with photosites 110 not fitted with filtering devices.

Each photosite 101 formed in a semiconducting substrate 3, initially P-doped, comprises a first semiconducting junction 1 comprising an N-doped layer 10 comprised between two P-doped layers 11 and 12 forming a pinched-off photodiode, and a second semiconducting junction 2, buried in the substrate 3 and placed beneath the first junction 1, comprising an N-doped layer 20 installed above a P-doped layer 21, forming another photodiode.

The installation of the layer 20 of the second junction 2 is carried out so that the layers 11 and 21 respectively of the first and second junctions 1 and 2 are coupled together. The first junction 1 is produced so as to retain an access to the layer 20 of the second junction 2 on the surface of the photosite 100. The layer 20 of the second junction 2 is configured in an L shape with a portion rising to the surface of the substrate 3 so as to polarize the second junction 2 at the second polarization voltage V2. The layer 10 of the first junction 1 is insulated from the layer 20 of the second junction 2 by an insulation wall 40.

Photosites 110 not fitted with filtering devices are placed on either side of a photosite 101 fitted with filtering devices.

One photosite 110 comprises a single junction 5 comprising an N-doped layer 50 comprised between two P-doped layers 51 and 52, forming a pinched-off photodiode.

The photosites 101 fitted with filtering devices are insulated from the photosites 110 not fitted with filtering devices by insulation walls 41 and 42.

In another embodiment, it is also possible to produce an imaging device comprising photosites fitted with filtering devices with different radiation ranges.

The filtering function of each photosite is thus produced at different depths so as to filter the undesirable radiation in the photosite.

As an example, a photosite configured to capture the red radiation will comprise a filtering device comprising a portion buried at a depth corresponding to the filtering of the infrared radiation.

A photosite configured to capture the blue radiation will comprise a filtering device buried at a depth corresponding to the filtering of the green radiation, of the red radiation, and of the infrared radiation.

A photosite configured to capture the green radiation will comprise a filtering device comprising a portion buried at a depth corresponding to the filtering of the red radiation and of the infrared radiation.

What is claimed is:

1. An imaging device comprising:
   a semiconducting substrate;
   a plurality of photosites disposed in the semiconducting substrate, each photosite including a filtering device configured to filter at least one undesired radiation, wherein at least a portion of the filtering device is buried in the semiconducting substrate at a depth depending on the wavelength of the undesired radiation; and
   a polarizing voltage source directly connected to the filtering device of each photosite, wherein the polarizing voltage source is configured to apply a constant non-zero voltage to remove charges generated as a result of the at least one undesired radiation.

2. The device according to claim 1, wherein the at least one undesired radiation comprises an infrared radiation and the portion is buried at a depth of between 2 μm and 5 μm.

3. The device according to claim 1, wherein the photosite comprises a first semiconducting P-N junction and the filtering device comprises a second semiconducting P-N junction located beneath the first semiconducting P-N junction.

4. The device according to claim 1, wherein two continuous semiconducting layers of opposite conductivity types are disposed in the substrate, wherein the buried portions of the filtering devices of adjacent photosites include the semiconducting layers.

5. The device according to claim 4, wherein the two continuous semiconducting layers form P-N junctions of the buried portions associated with the adjacent photo sites.

6. The device according to claim 1, wherein the plurality of photosites comprise a first group of photosites that are fitted with the filtering devices, the device further comprising a second group of photosites none of which are fitted with a filtering device.

7. The device according to claim 6, wherein, along a row of photosites, photosites of the first group alternate with photosites of the second group.

8. A method for operating the device according to claim 1, wherein the method comprises filtering the at least one undesired radiation illuminating at least one of the photosites disposed in the semiconducting substrate, wherein the filtering is carried out in the semiconducting substrate at the depth that is a function of the wavelength of the undesired radiation.

9. The method according to claim 8, wherein the at least one undesired radiation comprises infrared radiation and the filtering is carried out in the semiconducting substrate at a depth of between 2 μm and 5 μm.

10. The method according to claim 8, wherein the filtering comprises trapping electrons created in a second semiconductor junction of the photosite located beneath a first semiconductor junction of the photosite.

11. The method according to claim 10, wherein the second semiconductor junction in the photosite is polarized at the polarizing voltage, the polarizing voltage greater than a voltage at a sense node coupled to the first semiconductor junction in the photosite.

12. An imaging device comprising:
    a semiconducting substrate;
    a first region of a first conductivity type disposed in the semiconducting substrate and coupled to a sense node;
    a sensing circuit coupled to the sense node;
    a ground node;
    a second region of a second conductivity type disposed in the semiconducting substrate below the first region located such that the first region and the second region form a first junction configured to collect charge generated as a result of radiation of a first wavelength impinging upon a surface of the semiconducting substrate, wherein the second region is coupled to the ground node;
    a polarizing voltage source configured to apply a constant non-zero polarizing voltage;
    a third region of the first conductivity type disposed in the semiconducting substrate below the second region and directly connected to the polarizing voltage source; and
    a fourth region of the second conductivity type disposed in the semiconducting substrate below the third region such that the third region and the fourth region form a second junction that is configured to collect charge generated as a result of radiation of a second wavelength impinging upon a surface of the semiconducting substrate, the second wavelength different than the first wavelength, wherein the third region is connected to the constant non-zero polarizing voltage source and the fourth region is coupled to the ground node so that collected charge generated as a result of radiation of the second wavelength is carried away without being sensed.

13. The device according to claim 12, wherein the first region and the second region are divided into a plurality of photosites, each photosite being electrically isolated from an adjacent photosite.

14. The device according to claim 13, wherein the second junction is disposed continuously below the plurality of photosites.

15. The device according to claim 13, wherein the third and fourth regions are divided so that the second junction comprises a plurality of junctions extending laterally beneath the photosites.

16. The device according to claim 15, wherein the plurality of photosites comprise a first group of photosites and a second group of photosites, wherein a respective junction of the plurality of junctions is beneath each photosite in the first group and wherein no junction is beneath each photosite of the second group.

17. The device according to claim 16, wherein photosites of the first group alternate with photosites of the second group.

18. The device according to claim 12, wherein the first junction is located at a depth of between 0 and 0.5 μm beneath the surface and the second junction is located at a depth of between 2 and 5 μm beneath the surface.

19. An imaging device comprising:

a semiconducting substrate;

a first region of a first conductivity type disposed in the semiconducting substrate;

a second region of a second conductivity type disposed in the semiconducting substrate below the first region located such that the first region and the second region form a first junction configured to collect charge generated as a result of radiation of a first wavelength impinging upon a surface of the semiconducting substrate;

a third region of the first conductivity type disposed in the semiconducting substrate below the second region, wherein the third region is directly connected to a constant non-zero polarizing voltage, wherein the third region is directly connected to a polarizing voltage source; and a fourth region of the second conductivity type disposed in the semiconducting substrate below the third region such that the third region and the fourth region form a second junction that is configured to collect charge generated as a result of radiation of a second wavelength impinging upon a surface of the semiconducting substrate, the second wavelength different than the first wavelength;

wherein the first junction is configured to measure the charge generated as a result of the radiation of the first wavelength; and wherein the second junction is configured to filter the charge generated as a result of the radiation of the second wavelength.

20. The device according to claim 19, wherein the radiation of the first wavelength comprises visible radiation and wherein the radiation of the second wavelength comprises infrared radiation.

21. An imaging device comprising:

a semiconducting substrate;

a photosite in the semiconducting substrate;

sensing means for sensing carriers generated by radiation of a desired wavelength impinging upon the photosite; and filtering means buried in the semiconducting substrate beneath the photosite, the filtering means for filtering carriers generated by radiation of an undesired wavelength impinging upon the photosite by clearing away the carriers so that the carriers can never be sensed.

22. The device according to claim 21, wherein the at least one undesired radiation comprises an infrared radiation and the filtering means is buried at a depth of between 2 μm and 5 μm.

23. The device according to claim 21, comprising at least one set of adjacent photosites, each photosite associated with a corresponding filtering means, each of the filtering means being coupled together.

* * * * *